(12) United States Patent
Doyle et al.

(10) Patent No.: US 7,859,081 B2
(45) Date of Patent: Dec. 28, 2010

(54) CAPACITOR, METHOD OF INCREASING A CAPACITANCE AREA OF SAME, AND SYSTEM CONTAINING SAME

(75) Inventors: Brian S. Doyle, Portland, OR (US); Robert S. Chau, Beaverton, OR (US); Suman Datta, Beaverton, OR (US); Vivek De, Beaverton, OR (US); Ali Keshavarzi, Portland, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 635 days.

(21) Appl. No.: 11/731,543

(22) Filed: Mar. 29, 2007

(65) Prior Publication Data

US 2008/0237675 A1    Oct. 2, 2008

(51) Int. Cl.
*H01L 29/92* (2006.01)
(52) U.S. Cl. .............. 257/534; 257/303; 257/306; 257/309; 257/E27.092; 257/E21.646; 257/E21.648
(58) Field of Classification Search .............. 257/315
See application file for complete search history.

(56) References Cited

U.S. PATENT DOCUMENTS

| | | | | |
|---|---|---|---|---|
| 4,672,410 A * | 6/1987 | Miura et al. | ............... | 257/302 |
| 5,291,438 A * | 3/1994 | Witek et al. | ............... | 365/149 |
| 5,594,682 A * | 1/1997 | Lu et al. | ............... | 365/149 |
| 5,888,865 A * | 3/1999 | Lin | ............... | 438/253 |
| 6,153,901 A * | 11/2000 | Higashi | ............... | 257/301 |
| 6,204,186 B1 * | 3/2001 | Chaudhry et al. | ............... | 438/700 |
| 6,294,420 B1 * | 9/2001 | Tsu et al. | ............... | 438/239 |
| 6,399,982 B1 * | 6/2002 | Derderian et al. | ............... | 257/309 |
| 6,459,121 B1 * | 10/2002 | Sakamoto et al. | ............... | 257/315 |
| 6,768,158 B2 * | 7/2004 | Lee et al. | ............... | 257/315 |
| 6,972,451 B2 * | 12/2005 | Delpech et al. | ............... | 257/304 |
| 6,999,298 B2 * | 2/2006 | Hackler et al. | ............... | 361/303 |
| 7,005,700 B2 * | 2/2006 | Lee | ............... | 257/316 |
| 7,018,933 B2 * | 3/2006 | Kim et al. | ............... | 438/710 |
| 7,122,871 B2 * | 10/2006 | Lee et al. | ............... | 257/412 |
| 7,224,020 B2 * | 5/2007 | Wang et al. | ............... | 257/317 |
| 7,285,820 B2 * | 10/2007 | Park et al. | ............... | 257/316 |
| 7,514,324 B2 * | 4/2009 | Leslie | ............... | 438/269 |
| 7,521,301 B2 * | 4/2009 | Lee et al. | ............... | 438/157 |
| 2002/0014646 A1 * | 2/2002 | Tsu et al. | ............... | 257/296 |
| 2002/0163058 A1 * | 11/2002 | Chen et al. | ............... | 257/532 |
| 2003/0042531 A1 * | 3/2003 | Lee et al. | ............... | 257/315 |

(Continued)

*Primary Examiner*—Leonardo Andújar
*Assistant Examiner*—William Harriston
(74) *Attorney, Agent, or Firm*—Kenneth A. Nelson

(57) ABSTRACT

A capacitor includes a substrate (110, 210), a first electrically insulating layer (120, 220) over the substrate, and a fin (130, 231) including a semiconducting material (135) over the first electrically insulating layer. A first electrically conducting layer (140, 810) is located over the first electrically insulating layer and adjacent to the fin. A second electrically insulating layer (150, 910) is located adjacent to the first electrically conducting layer, and a second electrically conducting layer (160, 1010) is located adjacent to the second electrically insulating layer. The first and second electrically conducting layers together with the second electrically insulating layer form a metal-insulator-metal stack that greatly increases the capacitance area of the capacitor. In one embodiment the capacitor is formed using what may be referred to as a removable metal gate (RMG) approach.

8 Claims, 8 Drawing Sheets

U.S. PATENT DOCUMENTS

| | | | |
|---|---|---|---|
| 2004/0087085 A1* | 5/2004 | Lee et al. | 438/257 |
| 2004/0256647 A1* | 12/2004 | Lee et al. | 257/289 |
| 2004/0266088 A1* | 12/2004 | Luyken et al. | 438/202 |
| 2005/0014318 A1* | 1/2005 | Manger | 438/197 |
| 2005/0017377 A1* | 1/2005 | Joshi et al. | 257/903 |
| 2005/0048720 A1* | 3/2005 | Graham et al. | 438/264 |
| 2005/0093082 A1* | 5/2005 | Son et al. | 257/401 |
| 2005/0104096 A1* | 5/2005 | Lee et al. | 257/288 |
| 2005/0191820 A1* | 9/2005 | Tu et al. | 438/396 |
| 2005/0218427 A1* | 10/2005 | Joshi et al. | 257/192 |
| 2006/0022248 A1* | 2/2006 | Fischer et al. | 257/298 |
| 2006/0044915 A1* | 3/2006 | Park et al. | 365/222 |
| 2006/0046380 A1* | 3/2006 | Choi et al. | 438/238 |
| 2007/0007580 A1* | 1/2007 | Song et al. | 257/315 |
| 2007/0057301 A1* | 3/2007 | Wang et al. | 257/296 |
| 2007/0215954 A1* | 9/2007 | Mouli | 257/390 |
| 2007/0241395 A1* | 10/2007 | Wang et al. | 257/334 |
| 2007/0287255 A1* | 12/2007 | Doyle et al. | 438/279 |
| 2008/0023742 A1* | 1/2008 | Lee | 257/296 |
| 2008/0050874 A1* | 2/2008 | Won et al. | 438/250 |
| 2008/0087946 A1* | 4/2008 | Hsu et al. | 257/328 |
| 2008/0157225 A1* | 7/2008 | Datta et al. | 257/401 |
| 2008/0237796 A1* | 10/2008 | Doyle et al. | 257/534 |
| 2009/0134465 A1* | 5/2009 | Shimizu | 257/368 |
| 2010/0181607 A1* | 7/2010 | Doyle et al. | 257/301 |

* cited by examiner

CAPACITOR, METHOD OF INCREASING A CAPACITANCE AREA OF SAME, AND SYSTEM CONTAINING SAME

FIELD OF THE INVENTION

The disclosed embodiments of the invention relate generally to capacitors, and related more particularly to fin capacitors capable of use in embedded memory applications.

BACKGROUND OF THE INVENTION

Today's computer chips are increasingly dependent on robust memory architecture capable of quickly accessing and handling large amounts of data. Existing memory solutions such as off-chip physical dynamic random access memory (DRAM) that sit on the mother board separate from the computer chip require relatively large amounts of energy and suffer from high latency, resulting in power-performance loss. Latency problems have been addressed using 1T-1C DRAM cells embedded on the computer chip, but existing versions of such DRAM cells are frequently unable to meet ever-increasing capacitance demands. Accordingly, there exists a need for a large-size, high-density capacitor compatible with a 1T-1C embedded DRAM cell usable within a logic technology process.

BRIEF DESCRIPTION OF THE DRAWINGS

The disclosed embodiments will be better understood from a reading of the following detailed description, taken in conjunction with the accompanying figures in the drawings in which.

Figure 1:
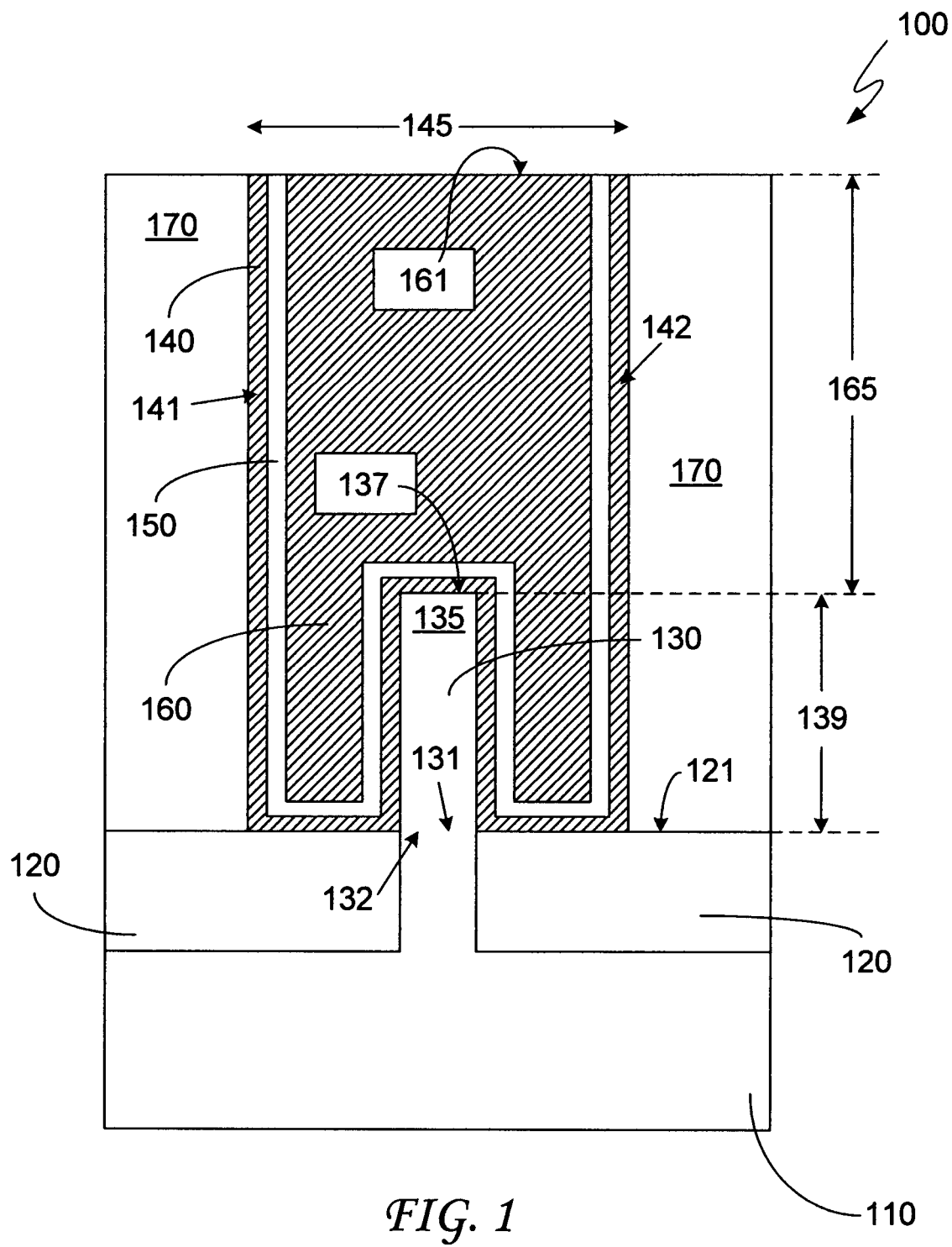
FIG. 1 is a cross-sectional view of a capacitor according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used.

DETAILED DESCRIPTION OF THE DRAWINGS

In one embodiment of the invention, a capacitor comprises a substrate, a first electrically insulating layer over the substrate, and a fin comprising a semiconducting material over the first electrically insulating layer. A first electrically conducting layer is located over the first electrically insulating layer and adjacent to the fin. A second electrically insulating layer is located adjacent to the first electrically conducting layer, and a second electrically conducting layer is located adjacent to the second electrically insulating layer. The first and second electrically conducting layers together with the second electrically insulating layer form a metal-insulator-metal stack that greatly increases the capacitance area of the capacitor.

Referring now to the figures, FIG. 1 is a cross-sectional view of a capacitor 100 according to an embodiment of the invention. As illustrated in FIG. 1, capacitor 100 comprises a substrate 110, an electrically insulating layer 120 over substrate 110, and a fin 130 comprising a semiconducting material 135 over electrically insulating layer 120. As an example, electrically insulating layer 120 can be an oxide slab having a surface 121. As another example, semiconducting material 135 can be silicon (Si), germanium (Ge), silicon germanium (SiGe), a III-V material such as gallium arsenide (GaAs), or the like. As yet another example, fin 130 can extend at least part way into electrically insulating layer 120. In one embodiment, for example, fin 130 has a portion 131 extending into electrically insulating layer 120 and a portion 132 protruding from surface 121 of electrically insulating layer 120. In the illustrated embodiment, portion 131 extends all the way through electrically insulating layer 120 and into substrate 110. In the same or another embodiment, fin 130 can be degenerately doped down to or below surface 121, and/or can be made electrically conducting through silicidation or the like.

Capacitor 100 further comprises an electrically conducting layer 140 over electrically insulating layer 120 and adjacent to fin 130, an electrically insulating layer 150 adjacent to electrically conducting layer 140, and an electrically conducting layer 160 adjacent to electrically insulating layer 150. An inter-layer dielectric (ILD) 170 is over electrically insulating layer 120 and at least partially surrounds fin 130. In a non-illustrated embodiment, capacitor 100 may be a decoupling capacitor. In the illustrated embodiment, capacitor 100 comprises a tri-gate storage capacitor, with the three gates located at the three interfaces between a face of fin 130 and an adjacent portion of electrically conducting layer 140, that may be used along with a tri-gate transistor as part of a 1T-1C DRAM cell. Such an arrangement will be further discussed below.

In one embodiment, electrically insulating layer 150 comprises a high-k dielectric material such as hafnium oxide ($HfO_2$), zirconium oxide ($ZrO_2$), lanthanum oxide ($LnO_2$), or the like, including combinations and/or laminates thereof, each of which have dielectric constants of approximately 20 to approximately 40. Compare this to silicon dioxide which was for many years widely used as a gate dielectric material and which has a dielectric constant ($\kappa$) of approximately 3.9. (Although the dielectric constant is often represented by the Greek letter $\kappa$, it is usually the lower case Roman letter "k" that is used in such phrases as "high-k dielectric material," and that convention will be followed here.) The dielectric constant of a vacuum, which is used as a scale reference point, is defined as 1. Accordingly, any material having a dielectric constant greater than about 5 or 10 would likely properly be considered a high-k material.

Existing DRAM capacitors based on tall fin architecture are characterized by a small capacitance area relative to the bitline capacitance that it needs to influence, and therefore require dielectrics with very high dielectric constants—perhaps much higher than the values around 20 to 40 that were mentioned in the preceding paragraph. Such dielectrics do exist, as for example lead zirconium titanate (PZT), which may have a dielectric constant greater than 100 and possibly approaching 500 or higher. Such materials, however, are often not compatible with wafer processing techniques and temperatures. Furthermore, materials with higher dielectric constants tend to leak charge more than those with lower dielectric constants, requiring more frequent rewriting or refreshing of the charge. Accordingly, although high-k dielectric materials may enhance capacitor performance, such materials must be carefully chosen in order to avoid problems such as those mentioned in this paragraph.

In at least one embodiment of the present invention, a capacitor's capacitance area is increased so that the capacitor is able to properly influence its bitline capacitance using a material having a dielectric constant large enough that it may properly be considered a high-k material but not so large that it is likely to lead to processing or charge refresh problems. As an example, capacitor 100 has an increased capacitance area that follows a linear distance marked by a length of electrically insulating layer 150. Such a capacitance area is greatly enhanced over that of a capacitor in which the metal-insulator-metal (MIM) stack is confined to the immediate region around fin 130, or to a similarly modest area.

Referring still to FIG. 1, electrically conducting layer 140 comprises a section 141 at a first side of fin 130 and a section 142 at an opposing second side of fin 130. An outside edge of section 141 and an outside edge of section 142 are separated by a distance 145. Portion 132 of fin 130 has a surface 137, and surface 137 and surface 121 are separated by a distance 139 which, in one embodiment (though not necessarily the embodiment depicted in FIG. 1), is between approximately six times and approximately twelve times greater than distance 145. Similarly, electrically conducting layer 160 has a surface 161, and surface 137 and surface 161 are separated by a distance 165. In one embodiment, distance 165 is at least approximately equal to distance 145 and may be up to approximately twice as great as distance 145. In the same or another embodiment, distance 139 is approximately five times greater than distance 165. Increasing the magnitude of distance 145 while keeping the distance ratios mentioned above may lead to improved performance for capacitor 100. More specifically, such improved performance may come as a result of an increased capacitance area, i.e., the amount of surface area available for the capacitor, as mentioned above. The capacitance area, and hence the capacitance, of capacitor 100 may be increased by, for example, increasing one or both of distances 139 and 165. In one embodiment, such an increase in distances 139 and/or 165 may be accomplished by opening up a hole at the level of metal 2 and then etching down through various films to surface 137 and then down to surface 121.

In one embodiment, electrically insulating layer 120 comprises an electrically insulating material, and in the same or another embodiment, electrically conducting layer 140 comprises an electrically conducting material. (In another embodiment electrically conducting layer 140 can comprise a semiconducting material.) In one embodiment, as mentioned above, the electrically insulating material of electrically insulating layer 120 is an oxide material. In the same or another embodiment, the electrically conducting material of electrically conducting layer 140 can be a metal having a work function that lies approximately mid-way between a conductive band and a valence band of the oxide or other electrically insulating material of electrically insulating layer 120. A material having a work function as described may be used to control leakage. As an example, the metal can be titanium nitride (TiN), tantalum nitride (TaN), or the like.

In one embodiment, electrically conducting layer 160 comprises an electrically conducting material that is the same as the electrically conducting material making up electrically conducting layer 140. In a different embodiment, however, electrically conducting layer 160 comprises an electrically conducting material that is different from the electrically conducting material making up electrically conducting layer 140. Using different electrically conducting materials may be desirable when, to take one example, processing issues dictate that one of the electrically conducting materials be more etchable than the other electrically conducting material.

Figure 2:
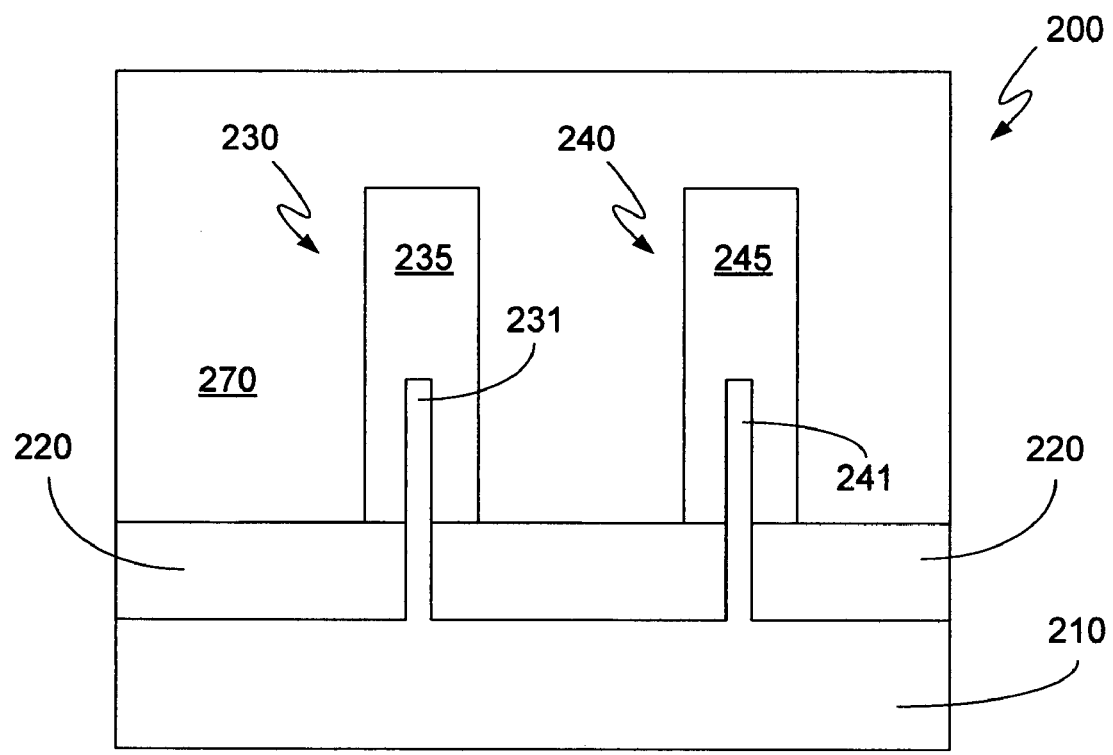
FIG. 2 is a cross-sectional view of a tri-gate memory cell at a particular point in its manufacturing process according to an embodiment of the invention.

FIG. 2 is a cross-sectional view of a tri-gate memory cell 200 at a particular point in its manufacturing process according to an embodiment of the invention. As illustrated in FIG. 2, tri-gate memory cell 200 comprises a substrate 210, an electrically insulating layer 220 over substrate 210, and a tri-gate capacitor 230 and a tri-gate transistor 240, which may be either an access or a logic transistor, over electrically insulating layer 220. Tri-gate capacitor 230 has a semiconducting fin 231. As an example, substrate 210, electrically insulating layer 220, and semiconducting fin 231 can be similar to, respectively, substrate 110, electrically insulating layer 120, and fin 130, all of which are shown in FIG. 1. Tri-gate transistor 240 has a semiconducting fin 241 which may be similar to semiconducting fin 231. A polysilicon region 235 at least partially surrounds tri-gate capacitor 230, and a polysilicon region 245 at least partially surrounds tri-gate transistor 240. Tri-gate capacitor 230 and tri-gate transistor 240 are at least partially surrounded by an ILD 270. As an example, ILD 270 can be similar to ILD 170, shown in FIG. 1.

Figure 3:
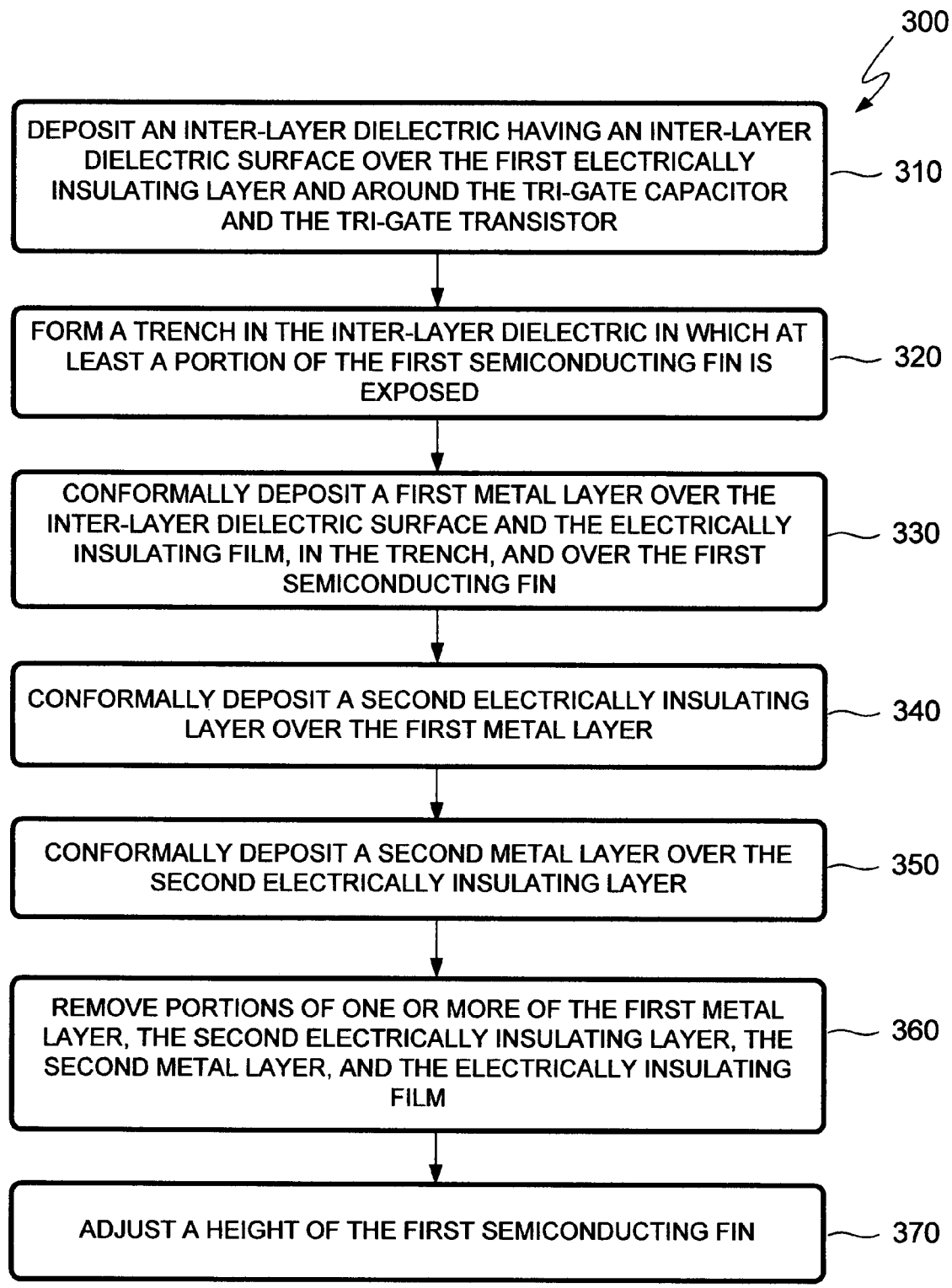
FIG. 3 is a flowchart illustrating a method of increasing a capacitance area of a tri-gate memory cell according to an embodiment of the invention.

FIG. 3 is a flowchart illustrating a method 300 of increasing a capacitance area of a tri-gate memory cell according to an embodiment of the invention, where the tri-gate memory cell comprises a substrate, a first electrically insulating layer over the substrate, and a tri-gate capacitor and a tri-gate transistor over the first electrically insulating layer, and where the tri-gate capacitor has a first semiconducting fin. As an example, the tri-gate capacitor can be similar to tri-gate capacitor 230 and the tri-gate transistor can be similar to tri-gate transistor 240, both of which are shown in FIG. 2. As another example, the first semiconducting fin can be similar to semiconducting fin 231, also shown in FIG. 2.

A step 310 of method 300 is to deposit an inter-layer dielectric having an inter-layer dielectric surface over the first electrically insulating layer and around the tri-gate capacitor and the tri-gate transistor. As an example, the inter-layer dielectric can be similar to inter-layer dielectric 270, shown in FIG. 2. Following the performance of step 310, the tri-gate memory cell is similar to tri-gate memory cell 200 as it is depicted in FIG. 2.

A step 320 of method 300 is to form a trench in the inter-layer dielectric in which at least a portion of the first semiconducting fin is exposed. The processing steps that form the trench may differ from one embodiment to another, and such processing differences may depend at least in part on the material that is adjacent to the exposed portion of the semiconducting fin. In the embodiment illustrated in FIG. 2, for example, semiconducting fin 231 is at least partially enclosed, as mentioned above, by an electrically conducting material such as polysilicon. In that embodiment, and as illustrated in FIGS. 4-7, described below, the trench may be formed by first removing a portion of the inter-layer dielectric, using a polishing step for example, in order to expose a surface of the electrically conducting material, and the electrically conducting material may then be removed in order to form the trench.

Figure 4:
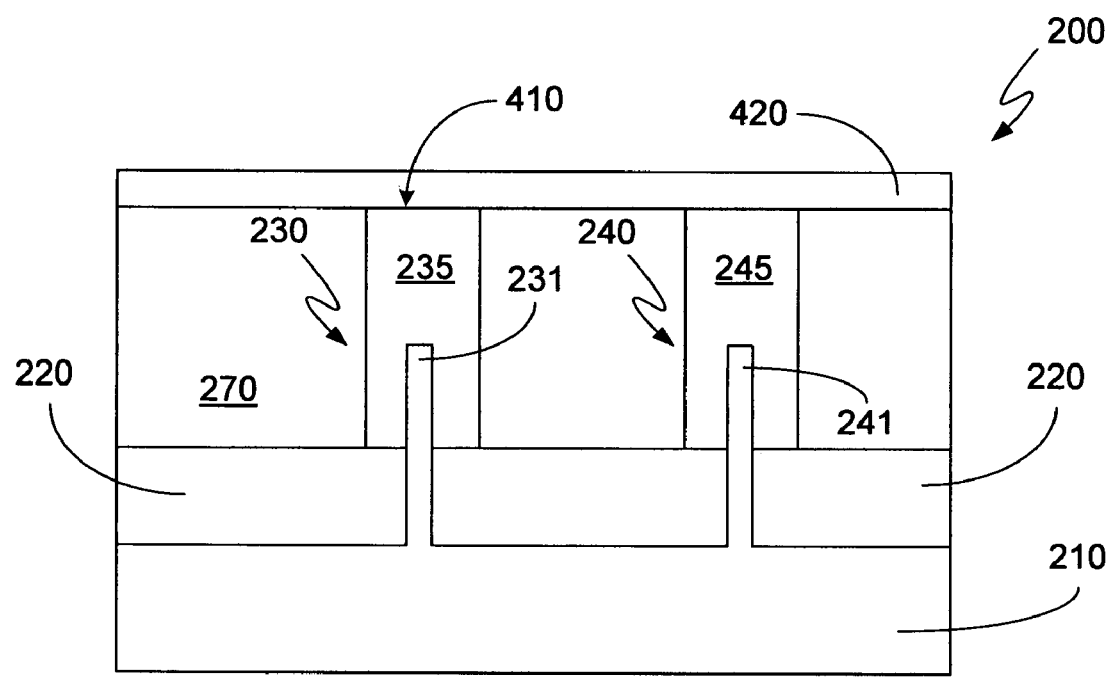
FIGS. 4-11 are cross-sectional views of the tri-gate memory cell of FIG. 2 at different points in its manufacturing process according to an embodiment of the invention.

As an example, the exposed surface of the electrically conducting material can be similar to a surface 410, first shown in FIG. 4, which is a cross-sectional view of tri-gate memory cell 200 at a particular point in its manufacturing process according to an embodiment of the invention. In one embodiment, removing the electrically conducting material in order to form the trench comprises depositing an electrically insulating film over the inter-layer dielectric surface, defining an opening for the tri-gate capacitor, thereby exposing a portion of the electrically insulating film, and removing the portion of the electrically insulating film. These steps place tri-gate memory cell 200 in a condition where the electrically conducting material may be removed without adversely affecting other portions of tri-gate memory cell 200. For example, these and other possible steps protect polysilicon region 245 around transistor 240 such that the polysilicon in polysilicon region 245 is not removed.

Referring still to FIG. 4, the electrically insulating film can be similar to an electrically insulating film 420 which, as an example, can be a layer of nitride, oxide, or the like. In one embodiment, another insulating film (not shown) may be deposited above electrically insulating film 420 in order to provide etch selectivity between layers.

Figure 5:
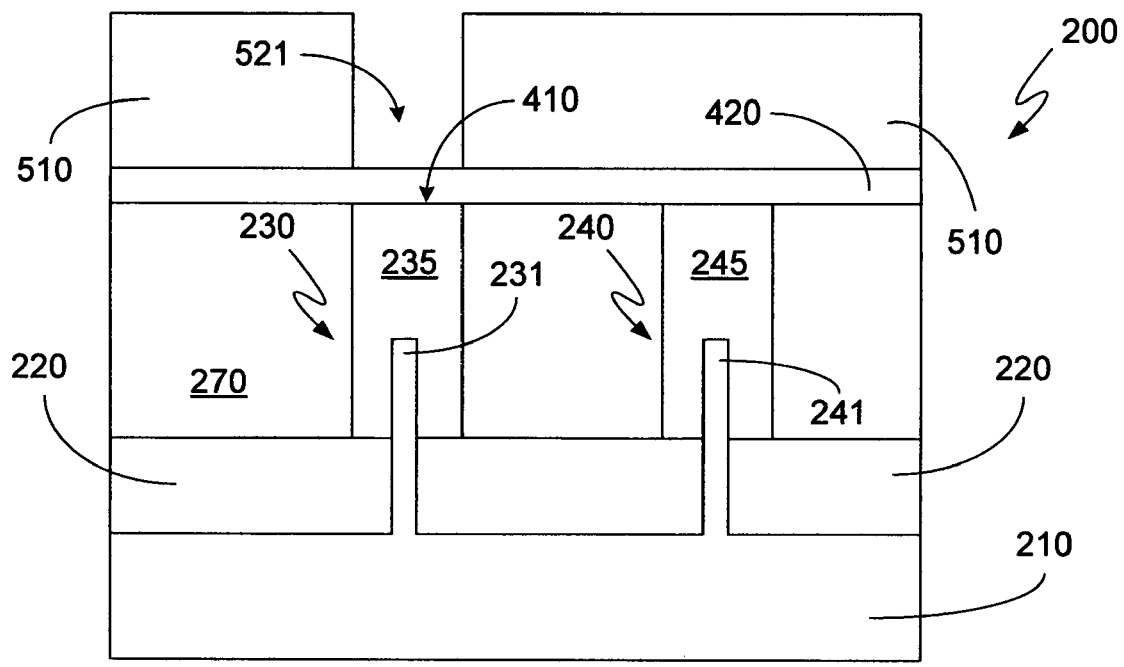
Figure 6:
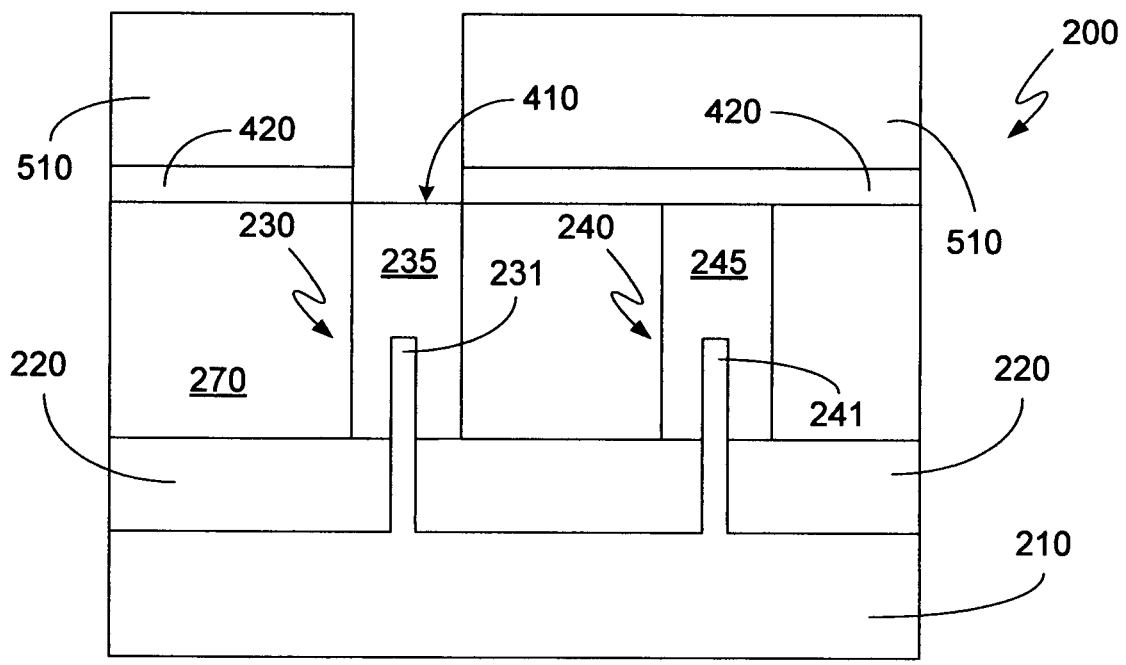
Figure 7:
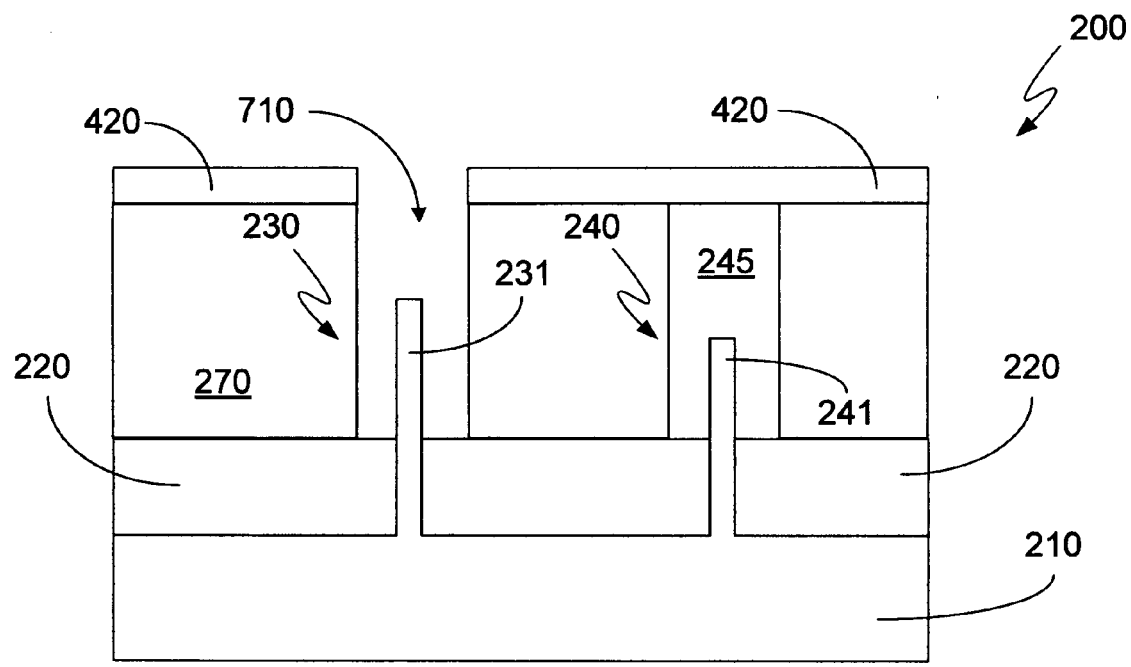

FIGS. 5-7 are a cross-sectional views of tri-gate memory cell 200 at particular points in its manufacturing process according to an embodiment of the invention. As illustrated in FIG. 5, the opening for the tri-gate capacitor may be defined and the portion of the electrically insulating film may be exposed by a lithography process in which a resist layer 510 is formed over electrically insulating film 420 except over a portion 521. The lithography is necessary because the tri-gate transistor needs to be protected from the polysilicon etch.

In FIG. 6, portion 521 (see FIG. 5) of electrically insulating film 420 has been removed and the electrically conducting material, i.e., polysilicon region 235, is in position for removal. FIG. 7 depicts tri-gate memory cell 200 after polysilicon region 235 has been removed and resist layer 510 has been stripped away so as to form a trench 710 in tri-gate memory cell 200. In one embodiment, polysilicon region 235 may be removed by etching the electrically conducting material. As an example, a wet etch such as ammonium hydroxide, tetramethylammonium hydroxide (TMAH), or the like may be used.

Figure 8:
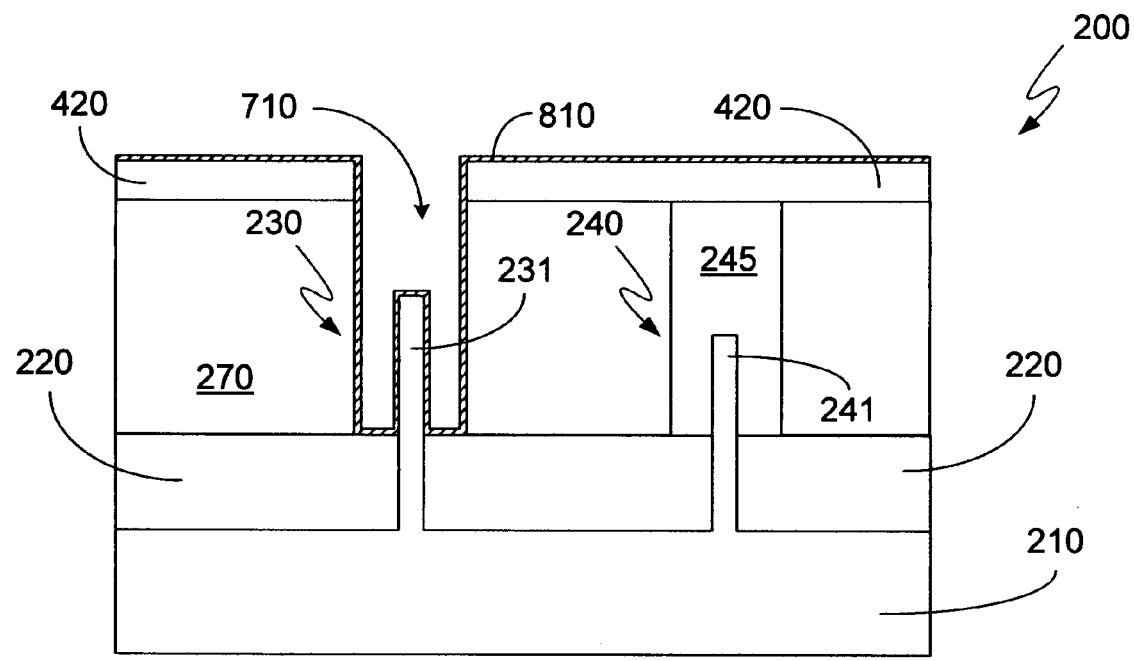

A step 330 of method 300 is to conformally deposit a first metal layer over the inter-layer dielectric surface and the electrically insulating film, in the trench, and over the first semiconducting fin. The first metal layer comprises a first metal that makes ohmic contact with the semiconducting fin, and that acts as the bottom electrode of the tri-gate capacitor. As an example, the first metal layer can be similar to electrically conducting layer 140, shown in FIG. 1. As another example, the first metal layer can be similar to a metal layer 810, first shown in FIG. 8 which is a cross-sectional view of tri-gate memory cell 200 at a particular point in its manufacturing process according to an embodiment of the invention. As an example, the deposition of step 330 may comprise an electroless deposition, a chemical vapor deposition (CVD) or CVD-like process, an atomic layer deposition (ALD), or the like. In one embodiment, step 330 comprises conformally depositing a layer comprising a metal having a work function that lies approximately mid-way between a conductive band and a valence band of an electrically insulating material that makes up the first electrically insulating layer.

Figure 9:
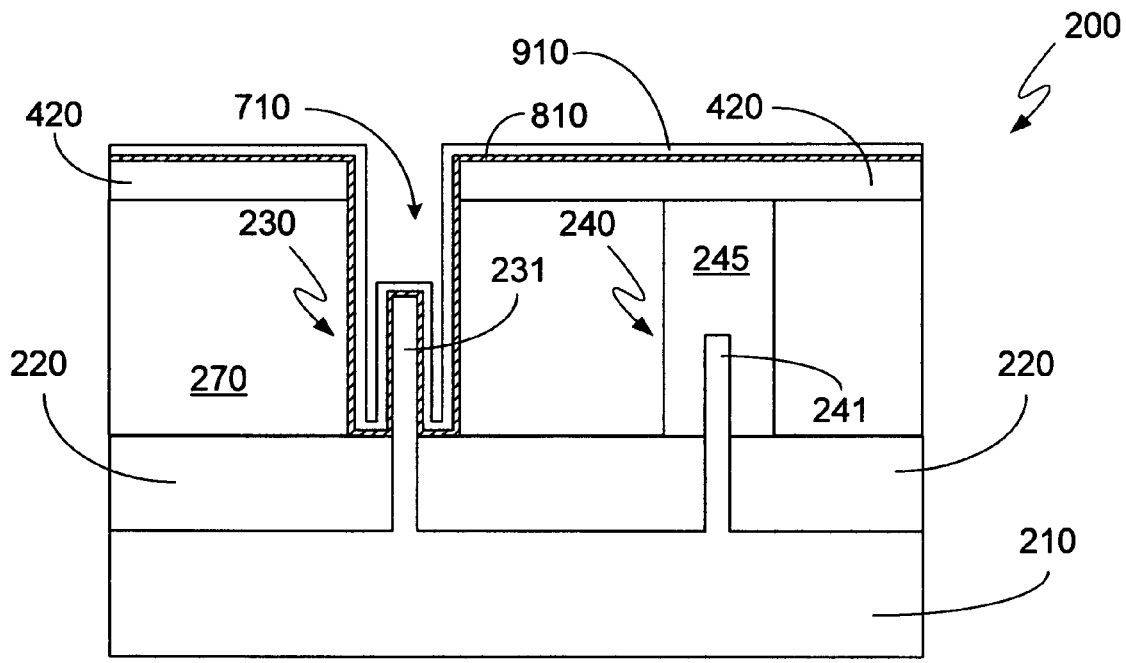

A step 340 of method 300 is to conformally deposit a second electrically insulating layer over the first metal layer. As an example, the second electrically insulating layer can be similar to electrically insulating layer 150, shown in FIG. 1. As another example, the second electrically insulating layer can be similar to an electrically insulating layer 910, first shown in FIG. 9 which is a cross-sectional view of tri-gate memory cell 200 at a particular point in its manufacturing process according to an embodiment of the invention. In one embodiment, step 340 comprises conformally depositing a high-k dielectric material.

Figure 10:
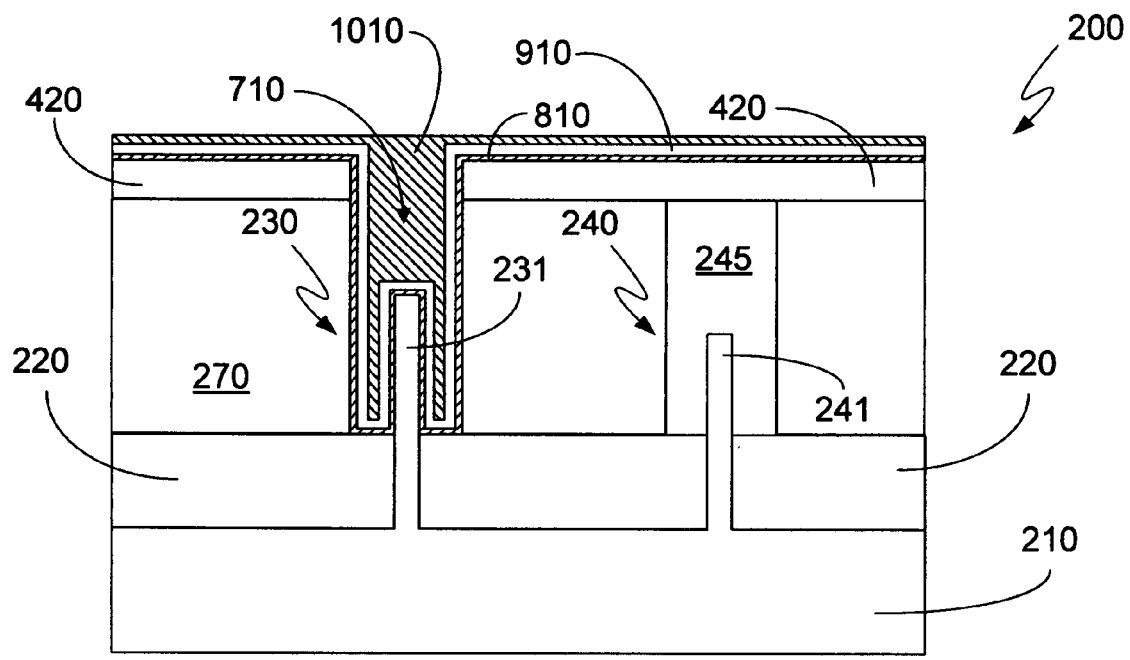

A step 350 of method 300 is to conformally deposit a second metal layer over the second electrically insulating layer. The second metal layer comprises a second metal that acts as the top electrode of the tri-gate capacitor. In one embodiment, the second metal layer fills or substantially fills the trench. As an example, the second metal layer can be similar to electrically conducting layer 160, shown in FIG. 1. As another example, the second metal layer can be similar to a metal layer 1010, first shown in FIG. 10 which is a cross-sectional view of tri-gate memory cell 200 at a particular point in its manufacturing process according to an embodiment of the invention. In one embodiment, step 350 comprises conformally depositing a layer comprising the first metal such that the first and second metal layers are made up of the same material. In a different embodiment, the metal making up the second metal layer is different from the metal making up the first metal layer.

Figure 11:
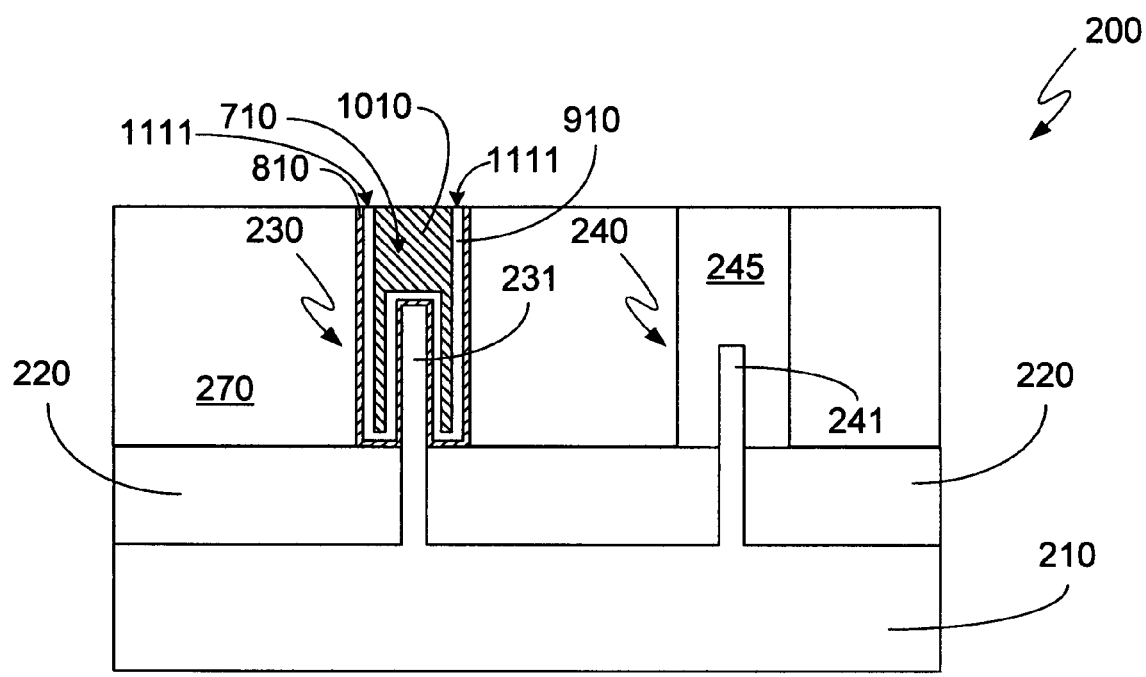

A step 360 of method 300 is to remove portions of one or more of the first metal layer, the second electrically insulating layer, the second metal layer, and the electrically insulating film. As an example, step 360 places tri-gate memory cell 200 in a condition such as that illustrated in FIG. 11, in which the MIM stack made up of metal layer 810, electrically insulating layer 910, and metal layer 1010 is just in trench 710 and not on ILD 270. As an example, step 360 may be accomplished using an etching or a polishing operation as known in the art.

In one embodiment, step 360 comprises creating an upper extremity of the second electrically insulating layer, and method 300 further comprises recessing the second metal layer below the upper extremity of the second electrically insulating layer. As an example, the upper extremity of the second electrically insulating layer can be similar to a surface 1111, first shown in FIG. 11, of electrically insulating layer 910. As an example, the second metal layer may be recessed below the upper extremity of the second electrically insulating layer in order to prevent unwanted electrical contact that may otherwise occur between the first and second metal layers.

A step 370 of method 300 is to adjust a height of the first semiconducting fin. Step 370 is an optional step that may in some embodiments not be performed. In an embodiment where step 370 is performed, a surface of the first electrically insulating layer is a first surface, the semiconducting fin has a second surface, the second electrically conducting layer has a third surface, a width of the trench is a first distance, a distance between the first surface and the second surface is a second distance, and a distance between the second surface and the third surface is a third distance. As an example, the first surface, the second surface, and the third surface can be similar to, respectively, surface 121, surface 137, and surface 161, all of which are shown in FIG. 1, and the first distance, the second distance, and the third distance can be similar to, respectively, distance 145, distance 139, and distance 165, all of which are also shown in FIG. 1. In one embodiment, step 370 comprises causing the height of the first semiconducting fin, i.e., the second distance, to be between approximately six times and approximately twelve times greater than the first distance. Step 370 may be followed by the formation of contacts to the tri-gate capacitor and the tri-gate transistor, and further processing steps as known in the art.

In an embodiment that is an alternative to the embodiment that has just been described, the ILD fills the region that in the foregoing embodiment was occupied by polysilicon, and in this alternative embodiment polysilicon is only present around the tri-gate transistor and not around the tri-gate capacitor. In this alternate embodiment the wet etch to remove polysilicon is not needed and is replaced by a dry etch of the oxide or other material making up the ILD. The other steps of method 300 may be used in this alternate embodiment without change from the way they are set forth in the previously-described embodiment. A possible advantage of the embodiment just described is that compared to other embodiments described herein it results in a greater amount of lateral space (equivalent to dimension 145 in FIG. 1) in which to fill in the various layers and portions of the capacitor, such as layers 140, 150, and 160, shown in FIG. 1 and described above.

Figure 12:
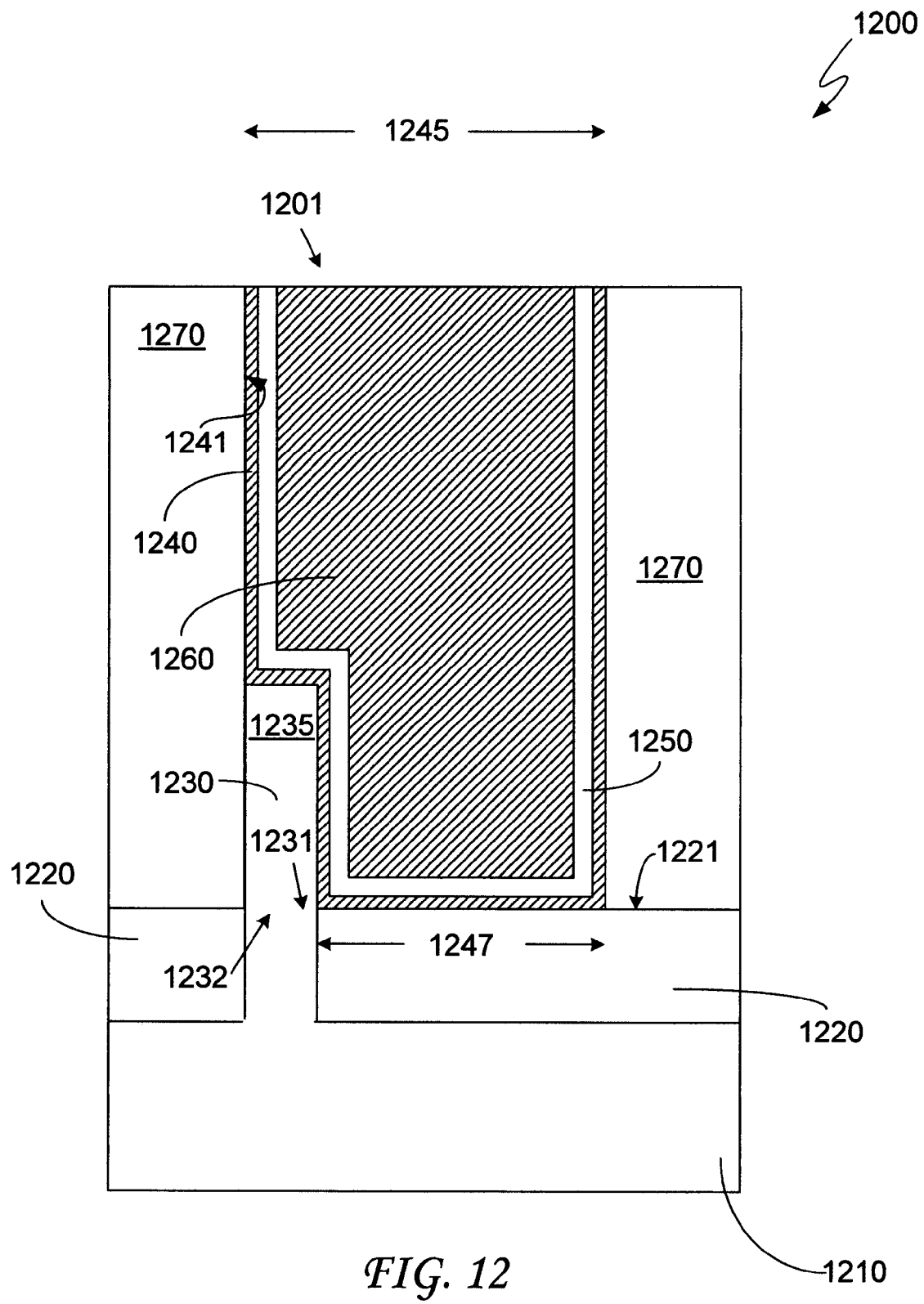
FIG. 12 is a cross-sectional view of a capacitor according to a different embodiment of the invention.

FIG. 12 is a cross-sectional view of a capacitor 1200 according to a different embodiment of the invention. As illustrated in FIG. 12, capacitor 1200 comprises a substrate 1210, an electrically insulating layer 1220 over substrate 1210, and a fin 1230 comprising a semiconducting material 1235 over electrically insulating layer 1220. As illustrated, fin 1230 is located immediately adjacent to a sidewall 1241 of a trench 1201 in which capacitor 1200 is formed, rather than being spaced apart from the trench sidewalls as was the case for capacitor 100 shown in FIG. 1. In the illustrated embodiment, the capacitor space is concentrated on the right-hand side of fin 1230. (In a different embodiment, fin 1230 could be moved so as to be immediately adjacent to the opposite sidewall of trench 1201, in which case the capacitor space would be concentrated to the left-hand side of fin 1230.)

Capacitor 1200 may be constructed in the same manner as that described above for capacitor 100 by making appropriate adjustments to the placement of the resist layer as readily understand by one of ordinary skill in the art. The construction of capacitor 1200 may be easier than that for capacitor 100 because the layout of capacitor 1200 provides more margin for the metal fills. Both capacitors 100 and 1200 require that five layers be fit into their respective trenches. Yet for equal trench widths (the trench widths are represented by distance 145 (see FIG. 1) for capacitor 100 and by a width 1245 (see FIG. 12) for capacitor 1200), the narrowest part (represented by a width 1247 in FIG. 12) of trench 1200 may easily be seen to be significantly wider than the narrowest part (unlabeled) of the capacitor 100 trench in FIG. 1.

As an example, electrically insulating layer 1220 can be an oxide slab having a surface 1221. As another example, semiconducting material 1235 can be silicon (Si), germanium (Ge), silicon germanium (SiGe), a III-V material such as gallium arsenide (GaAs), or the like. As yet another example, fin 1230 can extend at least part way into electrically insulating layer 1220. In one embodiment, for example, fin 1230 has a portion 1231 extending into electrically insulating layer 1220 and a portion 1232 protruding from surface 1221 of electrically insulating layer 1220. In the illustrated embodiment, portion 1231 extends all the way through electrically insulating layer 1220 and into substrate 1210. In the same or another embodiment, fin 1230 can be degenerately doped down to or below surface 1221, and/or can be made electrically conducting through silicidation or the like.

Capacitor 1200 further comprises an electrically conducting layer 1240 over electrically insulating layer 1220 and adjacent to fin 1230, an electrically insulating layer 1250 adjacent to electrically conducting layer 1240, and an electrically conducting layer 1260 adjacent to electrically insulating layer 1250. An ILD 1270 is over electrically insulating layer 1220 and at least partially surrounds fin 1230. In a non-illustrated embodiment, capacitor 1200 may be a decoupling capacitor. As was also the case for capacitor 100, capacitor 1200 may be used along with a tri-gate transistor as part of a 1T-1C DRAM cell. Such an arrangement was discussed in more detail above. However, like FIG. 1, FIG. 12 does not show the tri-gate transistor.

Figure 13:
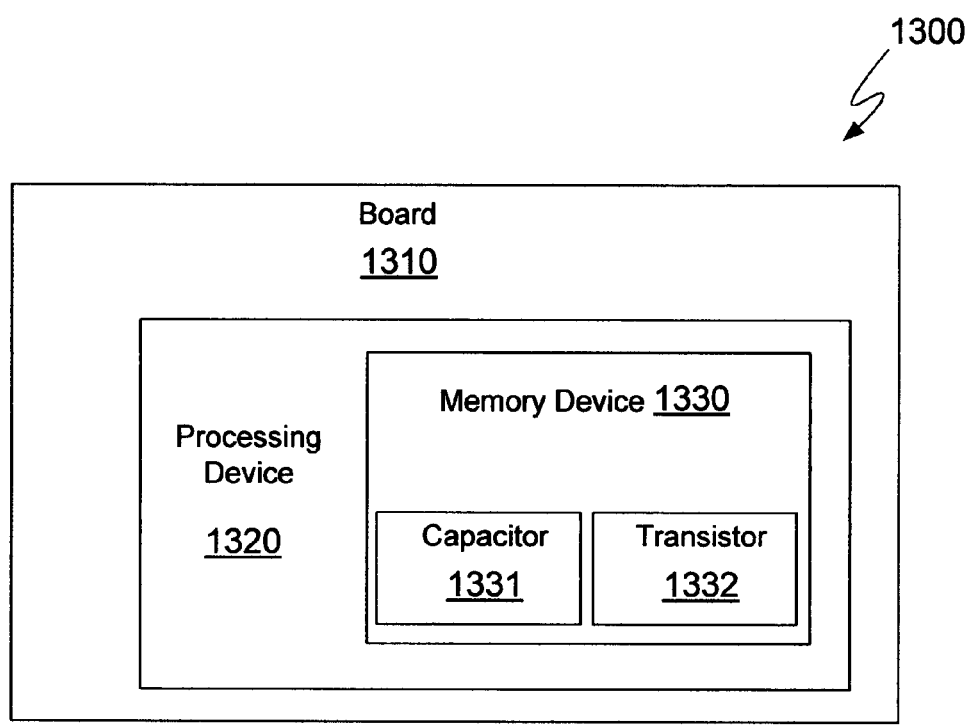
FIG. 13 is a schematic representation of a system including a capacitor according to an embodiment of the invention.

FIG. 13 is a schematic representation of a system 1300 including a capacitor according to an embodiment of the invention. As illustrated in FIG. 13, system 1300 comprises a board 1310, a processing device 1320 disposed on board 1310, and a memory device 1330 disposed on and coupled to processing device 1320. Memory device 1330 comprises a capacitor 1331. As an example, capacitor 1331 can be similar to capacitor 100, shown in FIG. 1. Accordingly, capacitor 1331 comprises a substrate, a first electrically insulating layer over the substrate, a fin comprising a semiconducting material over the first electrically insulating layer, a first electrically conducting layer over the first electrically insulating layer and adjacent to the silicon fin, a second electrically insulating layer adjacent to the first electrically conducting layer, and a second electrically conducting layer adjacent to the second electrically insulating layer. Each of the stated components can be similar to corresponding components of capacitor 100 and capacitor 230, described above and shown, respectively, in FIGS. 1 and 11.

In one embodiment, capacitor 1331 comprises a tri-gate storage capacitor and memory device 1330 further comprises a transistor 1332 adjacent to capacitor 1331. Transistor 1332 can be similar to tri-gate transistor 240, first shown in FIG. 2.

In the same or another embodiment, memory device 1330 is a dynamic random access memory cell.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the capacitor and related methods and systems discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A capacitor comprising:
a substrate;
a first electrically insulating layer over the substrate;
a fin comprising a semiconducting material over the first electrically insulating layer;
a first electrically conducting layer over the first electrically insulating layer and adjacent to the fin such that there exists no intervening layer between the first electrically conducting layer and the fin;
a second electrically insulating layer adjacent to the first electrically conducting layer; and
a second electrically conducting layer adjacent to the second electrically insulating layer,
wherein:
the first electrically insulating layer comprises an oxide layer having a first surface;
the fin is a silicon fin having a first portion extending into the first electrically insulating layer and having a second portion protruding from the first surface;
the second electrically insulating layer comprises a high-k dielectric material;
the first electrically conducting layer comprises a first section at a first side of the silicon fin and a second section at an opposing second side of the silicon fin;
a distance between an outside edge of the first section and an outside edge of the second section is a first distance;
the second portion of the silicon fin has a second surface;
a distance between the first surface and the second surface is a second distance; and
the second distance is between approximately six times the first distance and approximately twelve times the first distance.

2. The capacitor of claim 1 wherein:
the capacitor comprises a decoupling capacitor.

3. The capacitor of claim 1 wherein:
the capacitor comprises a tri-gate storage capacitor.

4. The capacitor of claim 1 wherein:
the second electrically conducting layer has a third surface;
a distance between the second surface and the third surface is a third distance; and
the third distance is at least approximately equal to the first distance and as large as approximately twice the first distance.

5. The capacitor of claim 1 wherein:
the first electrically insulating layer comprises a first electrically insulating material;
the first electrically conducting layer comprises a first electrically conducting material; and
the first electrically conducting material comprises a metal having a work function that lies approximately mid-way between a conductive band and a valence band of the first electrically insulating material.

6. The capacitor of claim 5 wherein:
the second electrically conducting layer comprises the first electrically conducting material.

7. A capacitor comprising:
a substrate;
a first electrically insulating layer over the substrate;
a fin comprising a semiconducting material over the first electrically insulating layer;
a first electrically conducting layer over the first electrically insulating layer and adjacent to the fin such that there exists no intervening layer between the first electrically conducting layer and the fin;
a second electrically insulating layer adjacent to the first electrically conducting layer; and
a second electrically conducting layer adjacent to the second electrically insulating layer, wherein:
the first electrically insulating layer comprises a first electrically insulating material;
the first electrically conducting layer comprises a first electrically conducting material; and
the first electrically conducting material comprises a metal having a work function that lies approximately mid-way between a conductive band and a valence band of the first electrically insulating material.

8. The capacitor of claim 7 wherein:
the second electrically conducting layer comprises the first electrically conducting material.

* * * * *